United States Patent

Kusumi

[11] Patent Number: 5,243,280
[45] Date of Patent: Sep. 7, 1993

[54] MAGNETIC SENSOR AND POSITION DETECTOR

[75] Inventor: Masaaki Kusumi, Kanagawa, Japan
[73] Assignee: Sony Magnescale, Inc., Tokyo, Japan
[21] Appl. No.: 852,727
[22] Filed: Mar. 17, 1992
[30] Foreign Application Priority Data Mar. 20, 1991 [JP] Japan .................................. 3-56968

[51] Int. Cl.⁵ ........................ G01B 7/14; G01R 33/06
[52] U.S. Cl. ........................... 324/207.21; 324/207.22; 324/252; 338/32 R; 307/309
[58] Field of Search ...................... 324/207.12, 207.21, 324/207.22, 207.23, 207.24, 207.25, 207.26, 207.20, 224, 252, 173, 174; 307/309; 338/32 R

[56] References Cited

U.S. PATENT DOCUMENTS

| 4,039,936 | 8/1977 | Jones et al. ...................... 324/207.21 |
| 4,480,248 | 10/1984 | Sado et al. .................. 324/207.21 X |
| 4,801,881 | 1/1989 | Kawata ........................... 324/207.21 |
| 4,806,860 | 2/1989 | Iijima et al. ..................... 324/207.21 |
| 4,818,939 | 4/1989 | Takahashi et al. ............. 324/207.21 |

FOREIGN PATENT DOCUMENTS

| 59-79806 | 5/1984 | Japan ............................. 324/207.21 |
| 63-293410 | 11/1988 | Japan ............................. 324/207.21 |
| 63-311117 | 12/1988 | Japan ............................. 324/207.21 |
| 1-32118 | 2/1989 | Japan ............................. 324/207.21 |
| 1-212313 | 8/1989 | Japan ............................. 324/207.21 |
| 2-285275 | 11/1990 | Japan ............................. 324/207.21 |

Primary Examiner—Gerard R. Strecker
Assistant Examiner—Warren S. Edmonds
Attorney, Agent, or Firm—Lewis H. Eslinger; Jay H. Maioli

[57] ABSTRACT

A magnetic sensor is disposed in an opposing relation to a magnetic scale in which a flat surface scale base made of a glass is plated by a magnetic material and a resultant plated layer is magnetized at a constant grating pitch. The magnetic sensor includes two magnetoresistance effect element groups disposed symmetrically with respect to a common central line. Since the surface of the magnetic scale is smooth, a clearance between the magnetic sensor and the magnetic scale can be kept substantially constant. When the magnetic sensor is moved in an opposing relation to the magnetic scale, a rise of temperature in the magnetoresistance effect elements is compensated for by the above symmetrical layout of the two magnetoresistance effect element groups. Therefore, when the magnetic sensor is moved over the magnetic scale in one direction and in the opposite direction, a dc fluctuation component in an output circuit can be reduced and the output circuit can generate a sine wave output of a constant amplitude having less waveform distortion.

3 Claims, 10 Drawing Sheets

F I G. 1
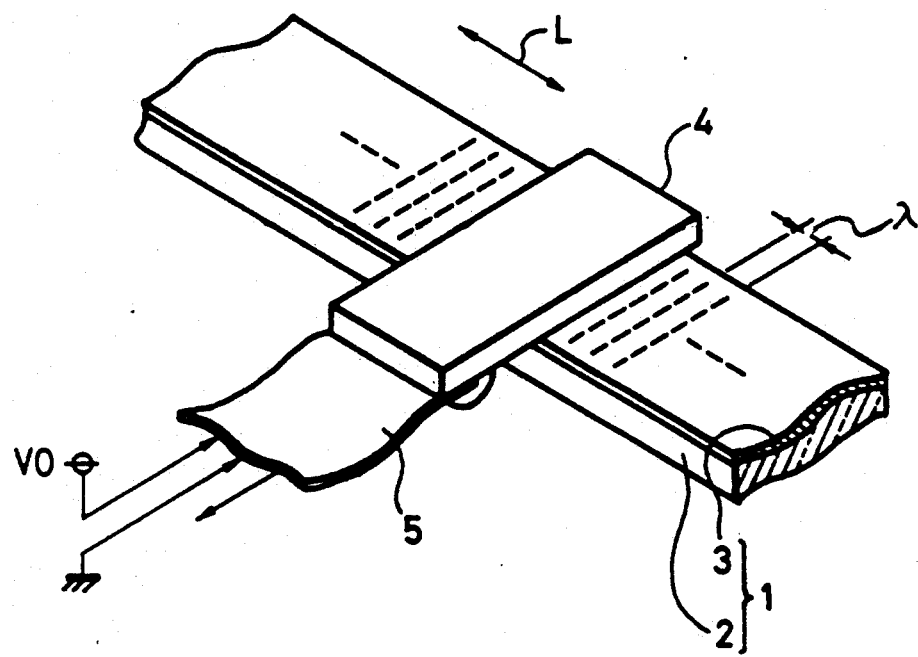

*FIG. 9A*
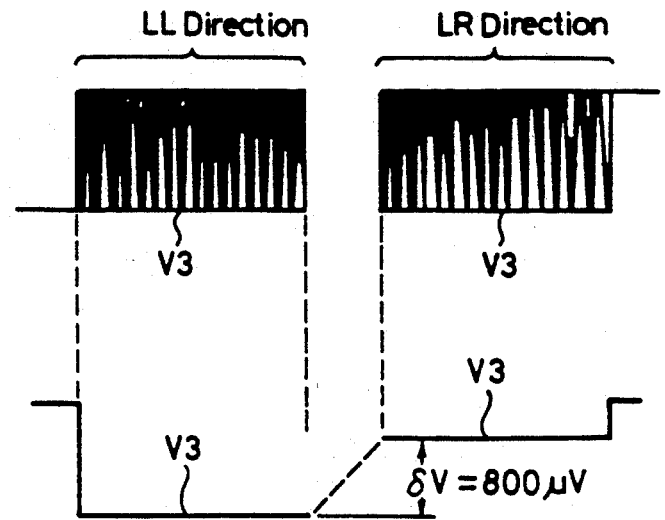
*FIG. 9B*
*FIG. 10*
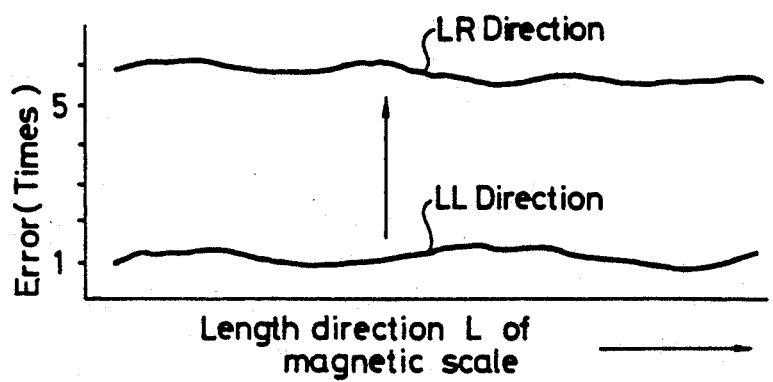

Prior-Art Pattern

Inventive Pattern

Inventive Pattern 33

Prior-Art Pattern

Inventive Pattern

Inventive Pattern

FIG.14A

FIG.14B
Prior-Art
Pattern

FIG.14C
Inventive
Pattern

FIG.14D
Inventive
Pattern

FIG.14E
Inventive
Pattern

MAGNETIC SENSOR AND POSITION DETECTOR

BACKGROUND OF THE INVENTION

1. Field of the Invention

The present invention relates to a magnetic sensor suitably applied to a read-out sensor which can read out a scale of a magnetic scale and to a position detector suitably applied to a machine tool or the like, for example.

2. Description of the Related Art

A position detector has been proposed so far, in which a magnetic sensor disposed in an opposing relation to a magnetic scale magnetized at a predetermined grating pitch is moved relatively with respect to the magnetic scale to thereby detect a relative position or the like from an electrical signal obtained on the basis of the change of a magnetic field. This position detector is applied to a machine tool which performs accurate machine work. In the industrial field utilizing the machine tool or the like, it is desired that the position detector becomes higher in accuracy when it is in use. In this case, a required resolution is about 0.1 $\mu$m and an interpolation accuracy is about 0.8 $\mu$m.

In order to realize the above-mentioned high accuracy, a grating pitch (i.e., recording wavelength) formed on the magnetic scale must be reduced to about 80 $\mu$m, for example, and an electrical division (interpolation) must be carried out simultaneously.

When the above-mentioned conditions are satisfied, an output signal from a magnetic sensor must satisfy three requirements below:

(1) A waveform of an output signal should become a sine wave which is less in distortion. For example, when a pitch of the output signal is electrically divided by 400, then a sine waveform whose signal-to-noise (S/N) ratio is about 50 to 60 dB must be provided.

(2) The output signal has no fluctuation (hereinafter referred to as a dc shift, if necessary) of a dc component. If any, only an extremely small dc fluctuation is permitted. For example, in order to obtain an accuracy of about 1/100 of the grating pitch, the fluctuation of the dc component must be reduced to less than 1% of the amplitude.

(3) An amplitude fluctuation of an output signal should be either locally or wholly small.

A magnetic sensor which can satisfy the aforesaid three requirements must be arranged so that an amplitude of an output signal voltage is large and a distortion component thereof is small, that is, the S/N ratio is large. Also, a magnetic scale which can satisfy the above three requirements must be arranged so that a signal electric field is large, uniform and very close to a sine wave.

A magnetic sensor using magnetoresistance effect elements (hereinafter simply referred to as MR elements) which can be formed by a photolithography technique is proposed as the magnetic sensor which can satisfy the above requirements. However, even when the MR elements are employed, a reproduced output signal voltage is unavoidably decreased in accordance with the reduction of the grating pitch because a magnetic field formed by a magnetic scale is reduced. Accordingly, to increase the reproduced output signal voltage, a spacing between the magnetic scale and the magnetic sensor, i.e., so-called clearance must be reduced. By way of example, the clearance must be reduced to about 40 $\mu$m. In addition, the clearance must be maintained as a constant value in order to keep the amplitude of the reproduced output signal voltage constant.

A material of a conventional magnetic scale is a magnetic alloy such as CuNiFe and FeCrCo. This magnetic alloy is partly not uniform in alloy component from a microscopic standpoint so that a uniform magnetic member, in other words, a magnetic field distribution corresponding to the sine wave having no distortion cannot be obtained over the full length of the magnetic scale. Further, a flatness of the surface of the above magnetic alloy is about 1s with the result that the clearance of about 40 $\mu$m cannot be kept constant locally. As a consequence, the amplitude of a reproduced signal voltage cannot be kept constant.

OBJECTS AND SUMMARY OF THE INVENTION

In view of the aforesaid shortcomings and disadvantages of the prior art, it is an object of the present invention to provide an improved magnetic sensor and a position detector in which the above shortcomings and disadvantages can be eliminated.

Another object of the present invention is to provide a magnetic sensor and a position detector in which a dc component fluctuation (i.e., dc shift) can be reduced.

Still another object of the present invention is to provide a magnetic sensor and a position detector which can generate an output of a sine wave signal of a constant amplitude having less waveform distortion.

A further object of the present invention is to provide a position detector of high accuracy.

A yet further object of the present invention is to provide a magnetic sensor suitably applied to a position detector.

As a first aspect of the present invention, a magnetic sensor having at least two magnetoresistance effect element groups is characterized in that each of the two magnetoresistance effect element groups is formed of at least two magnetoresistance effect elements connected in series, the magnetoresistance effect elements are disposed in parallel to each other and that the magnetoresistance effect elements are disposed substantially symmetrically with respect to a common central line in the direction substantially perpendicular to the parallel direction.

According to a second aspect of the present invention, a position detector having a magnetic scale magnetized at a constant grating pitch in its length direction and a magnetic sensor located in an opposing relation to the magnetic scale and which is made movable relatively to the magnetic scale in its length direction is characterized in that the magnetic scale is formed of a scale base made of a glass or the like having a flat surface and a plated layer formed on the scale base by plating a magnetic material, the plated layer being magnetized at the constant grating pitch, and the magnetic sensor is formed of at least two magnetoresistance effect element groups, and each of the magnetoresistance effect element groups is formed of at least two magnetoresistance effect elements connected in series, the magnetoresistance effect elements are disposed in parallel to each other and that the two magnetoresistance effect elements are disposed substantially symmetrically with respect to a common central line in the direction substantially perpendicular to the parallel direction.

In accordance with a third aspect of the present invention, a position detector having a magnetic scale magnetized at a constant grating pitch in its length direction and a magnetic sensor located in an opposing relation to the magnetic scale and which is made movable relatively to the magnetic scale in its length direction is characterized in that the magnetic scale is formed of a scale base made of a glass or the like having a flat surface and a plated layer formed on the scale base by plating a magnetic material, the plated layer being magnetized at the constant grating pitch, and the magnetic sensor is formed of at least two magnetoresistance effect element groups, the at least two magnetoresistance effect element groups are formed of at least two magnetoresistance effect elements connected in series, and the magnetoresistance effect elements of the at least two magnetoresistance effect element groups are disposed in parallel and alternately.

BRIEF DESCRIPTION OF THE DRAWINGS

A better understanding of the objects, features, and advantages of the invention can be gained from a consideration of the following detailed description of the preferred embodiments thereof, in conjunction with the figures of the accompanying drawings, wherein:

FIG. 1 is a perspective view illustrating a structure of a position detector according to an embodiment of the present invention;

FIGS. 9A and 9B are respectively schematic diagrams showing examples of measured dc shift in actual practice;

FIG. 10 is a schematic diagram showing the condition such that a read-out error of the position detector occurs in the presence of the dc shift;

FIG. 14A is a schematic diagram showing an arrangement of a magnetic scale from a function standpoint;

FIG. 14B is a schematic diagram showing an arrangement of a magnetic sensor according to the prior art;

FIG. 14C is a schematic diagram showing an arrangement of the magnetic sensor according to a fifth embodiment of the present invention;

FIG. 14D is a schematic diagram showing an arrangement of the magnetic sensor according to a sixth embodiment of the present invention; and FIG. 14E is a schematic diagram showing an arrangement of the magnetic sensor according to a seventh embodiment of the present invention.

DETAILED DESCRIPTION OF THE PREFERRED EMBODIMENTS

Figure 2:
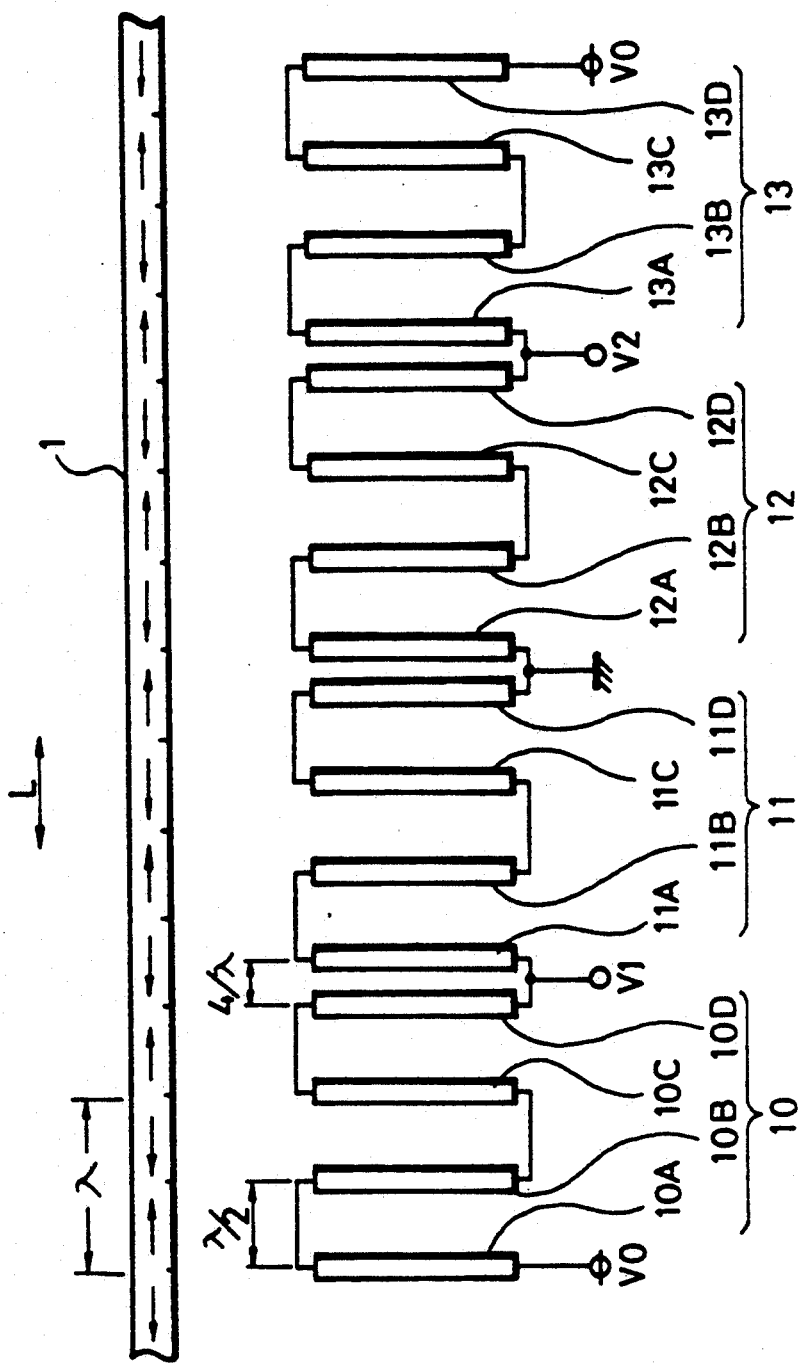
FIG. 2 is a schematic diagram showing an arrangement of an example of a position detector according to the prior art.

Prior to the description of the preferred embodiments of the present invention, a technique which becomes a premise of this embodiment and technical problems thereof will be described and then the embodiments which can solve the technical problems will be described next.

Initially, the technique which becomes a premise of this embodiment and its technical problem will be described below.

As shown in a perspective view forming FIG. 1, a magnetic scale 1 comprises a glass scale base 2 and a plated layer 3 which is provided by plating a magnetic material on the glass scale base 2. This plated layer 3 is magnetized at a grating pitch $\lambda$, e.g., $\lambda = 80$ $\mu$m. The magnetic scale 1 thus arranged is flat because the surface of the scale base 2 is the glass surface. Also, the plated layer 3 is formed on the flat glass surface and therefore the plated layer 3 also becomes flat. Further, the plated layer 3 is relatively high in durability against dusts, dirts, cutting oil or the like so that it is high in reliability and long in life under the condition that it is applied to the machine tool or the like. That is, the plating layer 3 is generally excellent as compared with a coating layer and a vapor-deposited layer. Although the scale base 2 may be made of a metal material, if a flatness substantially equal to that of glass is obtained by the metal material, then plenty of time is needed in the manufacturing process thereof and the magnetic scale becomes very expensive. Accordingly, in the following embodiment, let it be assumed that the magnetic scale 1 comprises the glass scale base 2 and the plated layer 3 made of magnetic material formed on the scale base 2 wherein the plated layer 3 is magnetized.

Technical problems to be solved when the glass magnetic scale 1 is utilized will be described below.

Technical problems are caused by a low thermal conductivity of the glass scale base 2 as compared with the metal scale base 2. More specifically, an MR element pattern formed on the side opposing the magnetic scale 1 in a magnetic sensor 4 is formed of a resistor. When in use, this MR element pattern formed of the resistor is applied with a voltage and thus generates a heat. On the other hand, although the clearance between the opposing surfaces of the magnetic scale 1 and the magnetic sensor 4 is extremely small so that the heat is also conducted to the magnetic scale 1, the thermal conductivity of the glass magnetic scale 1 is not so excellent as compared with that of the metal magnetic scale. As a consequence, a heat radiating property of the MR element pattern is deteriorated.

Consequently, when thenetic sensor 4 is set still and moved relatively with respect to the magnetic scale 1, temperature distributions of individual MR elements constructing the MR element pattern become different. Accordingly, the influence of the different temperature distributions causes technical problems which will be described in detail below.

When the magnetic scale 1 is in use, as shown in FIG. 1, the magnetic sensor 4 is disposed at the position opposing the magnetic scale 1 and this magnetic sensor 4 is made movable in the direction shown by an arrow L. The magnetic sensor 4 is formed of the MR element pattern formed on the base and is opposed at its surface of the MR element pattern to the plating layer 3 of the magnetic scale 1. The clearance between the surface of the MR element pattern and the surface of the magnetic scale 1, i.e., the plated layer 3 is about 40 μm.

The magnetic sensor 4 is coupled with a voltage source V0 and the ground voltage via a flexible substrate 5, and generates an output, caused by the change of the resistance value of the MR element, through the flexible substrate 5. In that event, the voltage source V0 is set to 5V (V0=V5).

FIG. 2 shows an example of the MR element pattern formed on the magnetic sensor 4 in association with the grating pitch (recording wavelength) λ of the magnetic scale 1.

Figure 3:
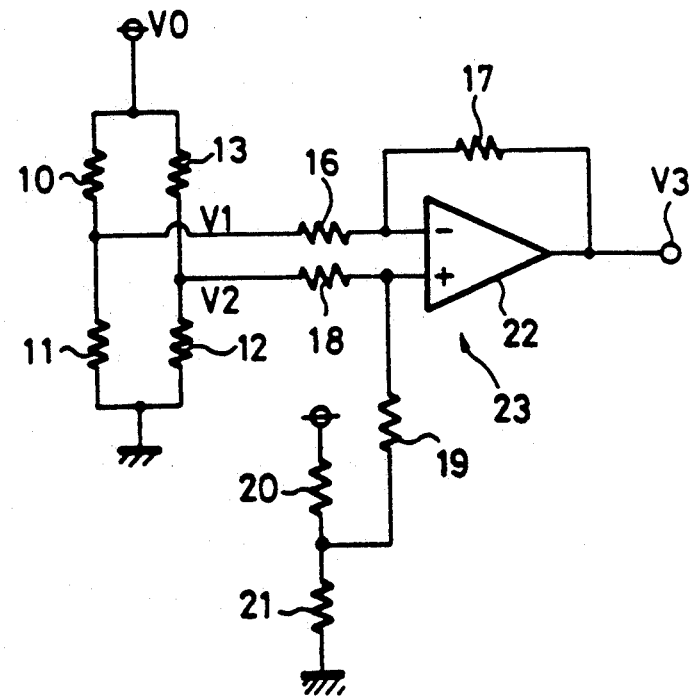
FIG. 3 is a schematic diagram showing an example of an output circuit generally utilized in the conventional position detector.

This MR element pattern includes four MR element groups 10 through 13 and the respective MR element groups 10 to 13 includes MR elements 10A to 10D; 11A to 11D; 12A to 12D; and 13A to 13D, respectively. The MR element groups 10 to 13 constitute the MR element pattern so that, when an output circuit is coupled to this magnetic sensor 4 or to the MR element pattern as, for example, shown in FIG. 3, then a very small fluctuation of magnetic recording in the magnetic scale 1 is averaged by an output V3, which becomes advantageous in making the magnetic sensor high in accuracy. In FIG. 3, resistors 16 through 21 and an operational amplifier 22 constitute a differential amplifier 23.

Figure 4:
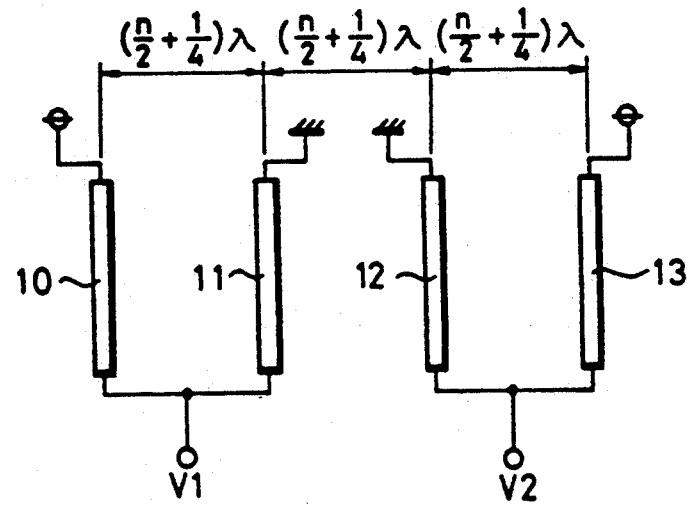
FIG. 4 is a schematic diagram showing an equivalent MR element pattern in the conventional position detector according to the example of FIG. 2.

The MR element pattern shown in FIG. 2 can be equivalently represented as shown in FIG. 4. For example, the MR element pattern 10 is assumed to exist at the center of the MR elements 10A through 10D in the length direction L. Accordingly, adjacent MR element groups, e.g., the MR element groups 10 and 11 are distant from each other by $\{(n/2)+(\frac{1}{4})\} \times \lambda$ where n=0, 1, 2, ..., and n is generally selected from approximately 6 to 8. Since the grating pitch λ is selected as 80 μm (λ=80 μm), the adjacent MR element groups, e.g., the MR element groups 10 and 11 are formed at the position distant from each other by about 300 μm.

Figure 5:
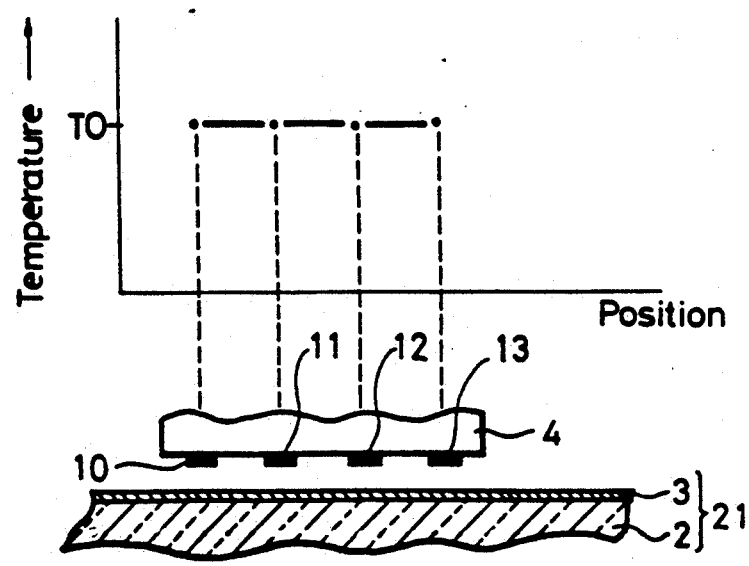
FIG. 5 is a schematic diagram showing temperature distributions of MR elements under the condition such that the magnetic sensor is set still.

A temperature distribution of the magnetic sensor 4 thus arranged will be described. When the temperature distribution of the magnetic sensor 4 is considered, let us utilize the magnetic scale 1 which is not magnetized and which is depicted by reference numeral 21 in FIG. 5. Under the condition that the magnetic sensor 4 is set still, then temperatures of the MR element groups 10 through 13 are constant at a reference temperature T0 as shown in FIG. 5. On the other hand, when the magnetic sensor 4 is moved in the direction shown by an arrow LL in FIG. 6, then the temperature of the MR element group 10 at the starting portion of the moving direction is decreased most while the temperatures of the succeeding MR element groups 11 to 13 are increased gradually. Further, when the magnetic sensor 4 is moved in the opposite direction shown by an arrow LR as shown in FIG. 7, the temperature distributions become opposite to those of FIG. 6.

A shift amount ΔV3 of the output V3 (see FIG. 3) provided when the magnetic sensor 4 is moved in the direction shown by the arrow LL can be expressed by the following equation, taking it consideration that the MR element has a positive temperature coefficient as:

$$\Delta V3 = -\Delta V2 - (+\Delta V1) = -(\Delta V1 + \Delta V2) < 0 \quad (1)$$

where ΔV1 and ΔV2 are the shift amounts of the outputs V1 and V2 (see FIG. 4), respectively.

On the other hand, when the magnetic sensor 4 is moved in the direction shown by the arrow LR, then a shift amount ΔV3' of an output V3' can be expressed by the following equation (2):

$$\Delta V3' = \Delta V2' - (-\Delta V1') = \Delta V1' + \Delta V2' > 0 \quad (2)$$

Accordingly, the shift amount of the output when the magnetic sensor 4 is moved in the respective directions, i.e., a so-called dc shift δV becomes about twice, i.e., ΔV3 as is given by the following equation (3):

$$\delta V = \Delta V3 - \Delta V3' = 2\Delta V3 \quad (3)$$

Figure 8:
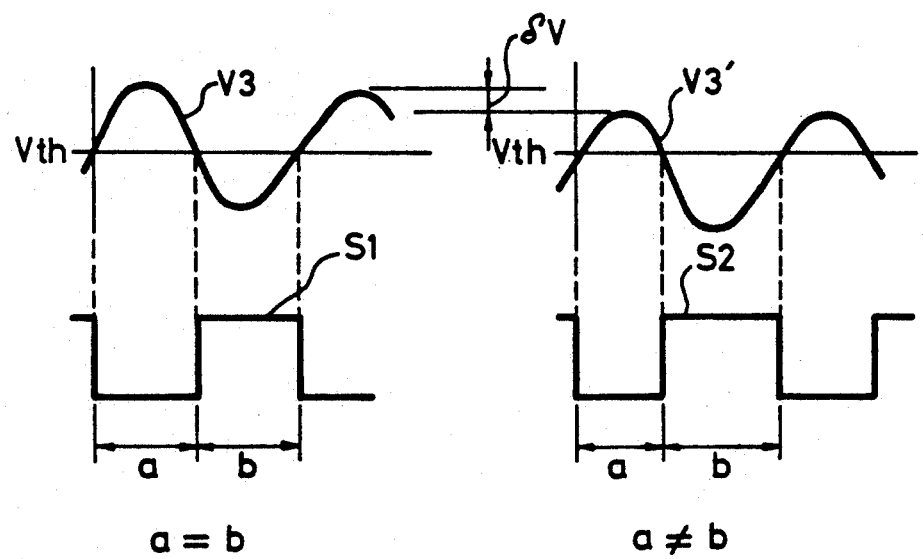
FIG. 8 is a diagram used to explain an influence exerted upon the interpolation processing by a dc shift when a sine wave signal from the output circuit shown in the example of FIG. 1 contains the dc shift.

When the output V3 is processed in the interpolation processing, as shown in FIG. 8, this dc shift δV changes a duty ratio of square wave signals S1, S2, which are wave-shaped by a threshold level Vth so as to become reference for the interpolation processing, from 1:1 (a=b) to the deteriorating (a≠b) direction, resulting in an interpolation error being increased.

This dc shift δV must be less than 1% of the amplitude of the output V3 in order to obtain an accuracy {(accuracy=λ/100)=80 μm/100=0.8} of about 1/100 of the grating pitch λ. Further, since the minimum amplitude of the output V3 is designed as about 30 mV, the dc shift δV should be less than about 300 δV.

However, when the magnetic sensor 4 is moved on the magnetic scale 1 magnetized in actual practice, as shown in FIG. 9B, if the magnetic sensor 4 is moved in the LL direction and in the opposite LR direction, then it was observed that the dc shift δV reaches to 800 μV (δV=800 μV). FIG. 9A shows waveforms observed by an oscilloscope and FIG. 9B shows waveforms which are provided by processing the waveforms of FIG. 9A by a low-pass filter in order to observe the dc component. A dark portion in FIG. 9A represents a sine wave of the output V3 (observed as shown in FIG. 9A because the time axis is long as compared with the sine wave cycle).

In actual practice, when a proper interpolation processing is carried out to normalize a read-out error in the LL direction to "1", as shown in FIG. 10, a read-out error in the LR direction becomes as large as about 5.8 times.

Figure 6:
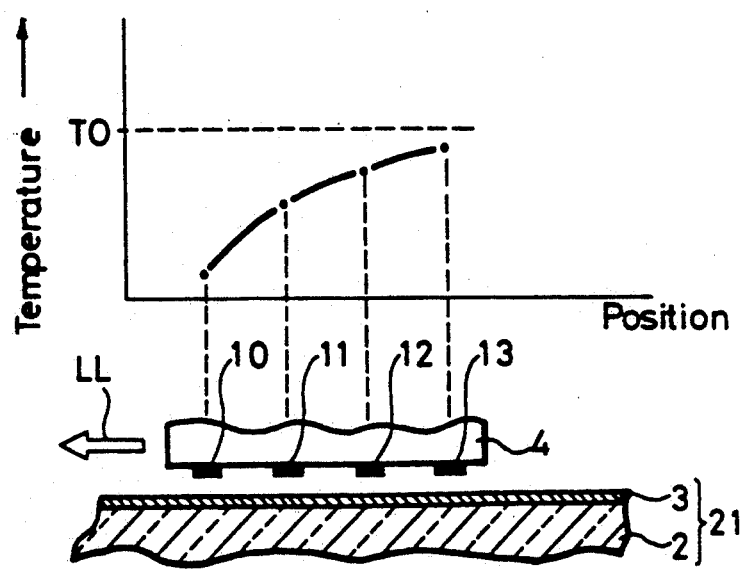
FIG. 6 is a schematic diagram showing temperature distributions of MR elements under the condition such that the magnetic sensor is moved in the left-hand direction.
Figure 7:
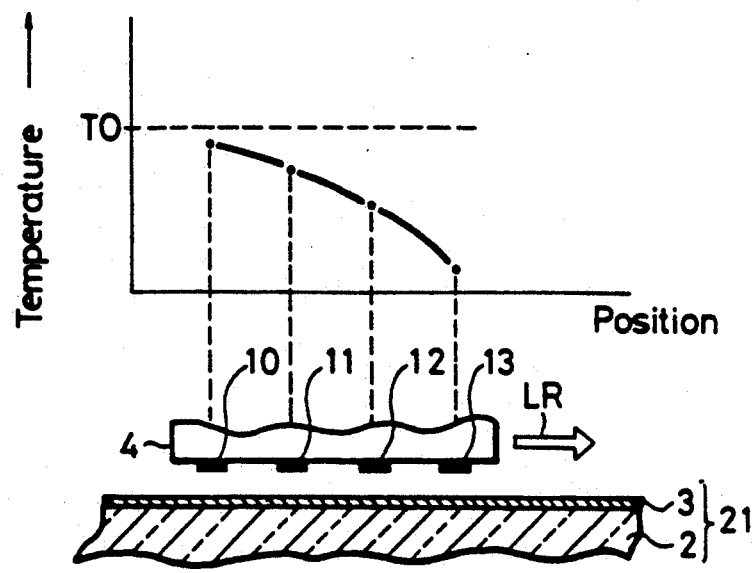
FIG. 7 is a schematic diagram showing temperature distributions of MR elements under the condition such that the magnetic sensor is moved in the right-hand direction.

The reason that the read-out error occurs is that, as shown in FIGS. 6 and 7, when the magnetic sensor 4 is moved over the magnetic scale 1, then the magnetic sensor 4 has the temperature gradients relative to the length direction L (LL, LR). Accordingly, the technical problem to be solved is to reduce or to thoroughly eliminate the temperature gradients.

Embodiments, which can solve the aforesaid technical problems, will be described below. In the embodiments below, like parts corresponding to those of FIGS. 1 to 10 are marked with the same references and therefore need not be described in detail.

Figures 11A, 11B, 11C, 11D:
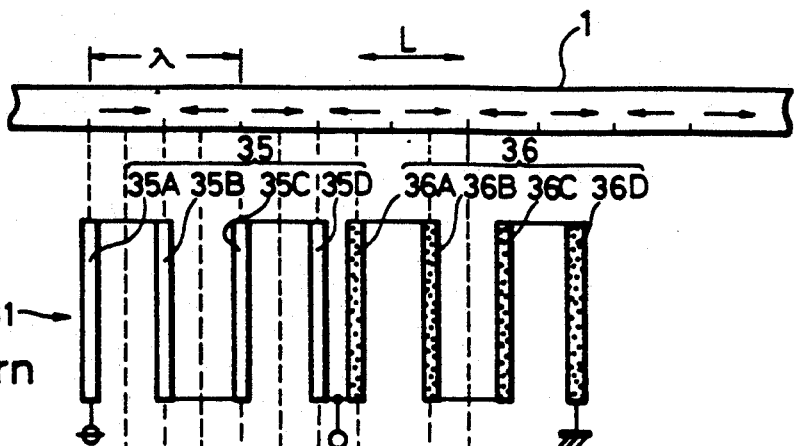
FIG. 11A is a schematic diagram showing an arrangement of a magnetic scale from a function standpoint.
FIG. 11B is a schematic diagram showing an arrangement of a magnetic sensor according to the prior art.
FIG. 11C is a schematic diagram showing an arrangement of a magnetic sensor according to a first embodiment of a magnetic sensor according to the present invention.
FIG. 11D is a schematic diagram showing an arrangement of the magnetic sensor according to a second embodiment of the present invention.

FIG. 11A shows a structure of the magnetic scale 1 magnetized at the grating pitch λ; FIG. 11B shows a structure of a magnetic sensor 31 according to the prior art; FIG. 11C shows a structure of a magnetic sensor 32 according to a first embodiment of the present invention; and FIG. 11D shows a structure of a magnetic sensor 33 according to a second embodiment of the present invention.

The magnetic sensor 32 shown in FIG. 11C includes two MR element groups 35 and 36 connected in series and the two MR element groups 35, 36 include four MR elements 35A through 35D and four MR elements 36A through 36D connected in series, respectively. The four MR elements 35A through 35D and the four MR elements 36A through 36D are respectively disposed in parallel to one another in the direction W perpendicular to the length direction L and are also disposed substantially symmetrically with respect to a central line 37 in the length direction L perpendicular to the above parallel direction W.

The magnetic sensor 33 shown in FIG. 11D includes two MR element groups 35 and 36 connected in series and these two MR element groups 35, 36 include four MR elements 35A through 35D and four MR elements 36A through 36D connected in series. The four MR elements 35A through 35D and the four MR elements 36A through 36D are respectively disposed in parallel and one another in the parallel direction W. In the magnetic sensor 33, a crossing portion of the MR element and a conductor, e.g., a crossing portion 39 may be formed as a bilayer structure via an insulating member (not shown in FIG. 11D).

Figure 12:
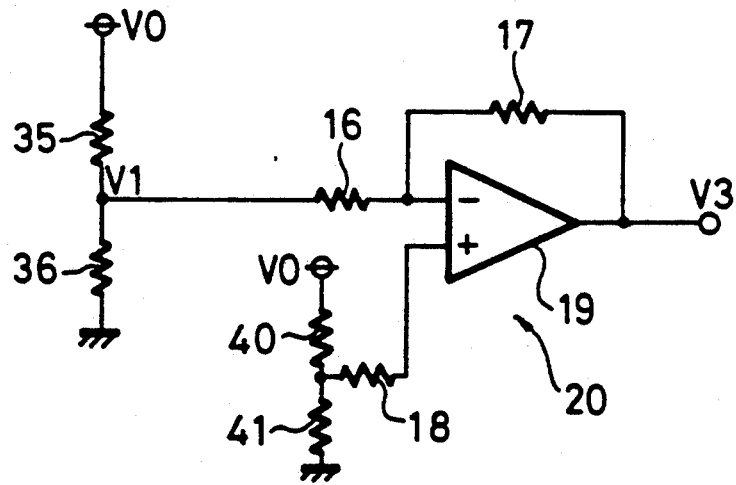
FIG. 12 is a schematic diagram showing an example of an output circuit for magnetic sensors shown in FIGS. 11 and 13.

FIG. 12 shows an example of an output circuit of the magnetic sensors 32, 33 shown in FIGS. 11C and 11D. In the output circuit shown in FIG. 12, resistance values of resistors 40 and 41 might be selected in association with the values of the MR element groups 35, 36.

Figure 13A:
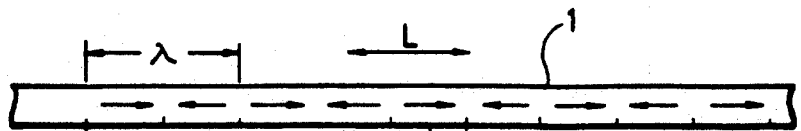
FIG. 13A is a schematic diagram showing an arrangement of a magnetic scale from a function standpoint.
Figure 13B:
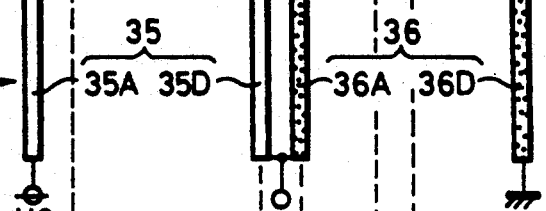
FIG. 13B is a schematic diagram showing an arrangement of a magnetic sensor according to the prior art.
Figure 13C:
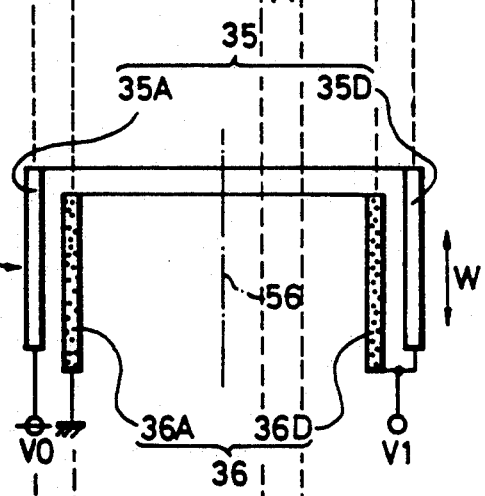
FIG. 13C is a schematic diagram showing an arrangement of the magnetic sensor according to a third embodiment of the present invention.
Figure 13D:
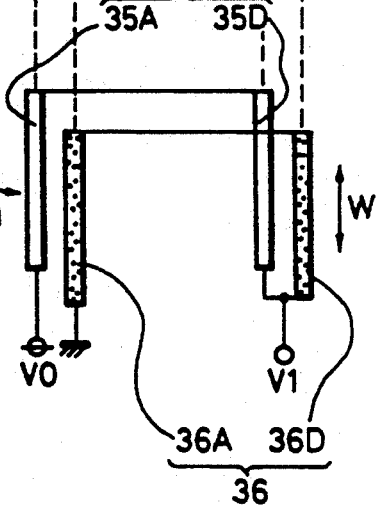
FIG. 13D is a schematic diagram showing an arrangement of the magnetic sensor according to a fourth embodiment of the present invention.

FIGS. 13A through 13D are schematic diagrams showing other embodiments of the present invention, wherein FIG. 13A shows a structure of the magnetic scale 1 magnetized at the grating pitch λ; FIG. 13B shows a structure of a magnetic sensor 53 according to the prior art; FIG. 13C shows a structure of a magnetic sensor 54 according to a third embodiment of the present invention; and FIG. 13D shows a structure of a magnetic sensor 55 according to a fourth embodiment of the present invention.

The magnetic sensor 54 shown in FIG. 13C includes the two MR element groups 35, 36 connected in series and the two MR element groups 35, 36 includes two MR elements 35A, 35D and two MR elements 36A, 36D connected in series, respectively. These two MR elements 35A, 35D and two MR elements 36A, 36D are disposed in parallel to each other in the parallel direction W and also disposed substantially symmetrically with respect to a central line 56 in the length direction L perpendicular to the parallel direction W.

The magnetic sensor 55 shown in FIG. 13D includes two MR element groups 35, 36 connected in series and the two MR element groups 35, 36 include two MR elements 35A, 35D and two MR elements 36A, 36D connected in series respectively. These two MR elements 35A, 35D and two MR elements 36A, 36D are disposed in parallel to each other and alternately in the parallel direction W.

The circuit shown in FIG. 12 is applied to output circuits of the magnetic sensors 54, 55 shown in FIGS. 13C, 13D.

FIGS. 14A through 14D are schematic diagrams showing further embodiments of the present invention, wherein FIG. 14A shows a structure of the magnetic scale 1 magnetized at the grating pitch λ; FIG. 14B shows a structure of a magnetic sensor 63 according to the prior art; FIG. 14C shows a structure of a magnetic sensor 64 according to a fifth embodiment of the present invention; FIG. 14D shows a structure of a magnetic sensor 65 according to a sixth embodiment of the present invention; and FIG. 14E shows a structure of a magnetic sensor 66 according to a seventh embodiment of the present invention.

The magnetic sensor 64 shown in FIG. 14C includes two MR element groups 10, 11 connected in series and two MR element groups 12, 13 similarly connected in series. These MR element groups 10 through 13 include four set of MR elements 10A to 10D, 11A to 11D, 12A to 12D and 13A to 13D connected in series, respectively.

These four MR elements 10A through 10D and four MR elements 11A through 11D are disposed in parallel to each other in the parallel direction W and also disposed such that they become substantially symmetrical with respect to a central line 47 in the length direction L perpendicular to the parallel direction W. In a like manner, those four MR elements 12A through 12D and four MR elements 13A through 13D are disposed in parallel to each other in the parallel direction W and also disposed in such a fashion that they become substantially symmetrical with respect to a central line 48 in the length direction L perpendicular to the parallel direction W.

The magnetic sensor 65 shown in FIG. 14D is different from the magnetic sensor 64 shown in FIG. 14C only in that the MR element groups 11 and 13 are substantially replaced with each other.

The magnetic sensor 66 shown in FIG. 14E might be such one that the magnetic sensors 33 shown in FIG. 11D distant from each other by $(2+(\frac{1}{4}))\lambda$ in the length direction L are disposed in parallel by a distance $(\frac{1}{4})\lambda$.

Output circuits of the magnetic sensors 64 to 66 shown in FIGS. 14C through 14E might be arranged similarly to the output circuit shown in FIG. 3.

By constructing the magnetic sensor as shown in FIG. 14C, i.e., by disposing the MR element groups 10, 12 at substantially the same position in the length direction L and also the MR element groups 12, 13 at the same position in the length direction L in the magnetic sensor 4 shown in FIGS. 5 to 7 or by disposing the MR element groups 10, 13 and the MR element groups 11, 12 at substantially the same positions in the length direction L as shown in FIG. 14D, the MR element pattern whose temperature can be compensated for is provided. When the magnetic sensor 64 thus arranged was moved over the magnetic scale 1 and the waveform of the output V3 was observed by the oscilloscope, then the dc shift value $\delta V$ shown in FIG. 9B was reduced substantially to zero When the read-out error in the LL direction is normalized as "1" by a proper interpolation process, then the read-out error in the LR direction was multiplied by 1 similarly (i.e., condition such that the characteristic of the LR direction overlaps that of the LL direction in FIG. 10). Incidentally, when the magnetic sensors were constructed as shown in FIGS. 14C to 14E, a local error in the read-out error characteristic of the length direction of the magnetic scale 1 could be reduced considerably.

Substantially similar measured results were obtained in the magnetic sensors 32, 33, 54 and 55 shown in FIGS. 11C, 11D, 13C and 13D.

As described above, according to the embodiments of the present invention, since the surface of the magnetic scale 1 is formed by magnetizing the plated layer 3 formed on the glass scale base 2, the surface of the magnetic scale 1 can be made smooth. Further, since the MR element pattern whose temperature compensation is possible is formed as shown by the magnetic sensor 32 or the like, the sine wave signal of the output V3 has a relatively small waveform distortion and becomes a signal having a constant amplitude. Further, the position detector can be obtained, in which the dc shift in the output V3 is negligibly small (i.e., hardly observed by the oscilloscope) even when the magnetic sensor is moved over the magnetic scale in the opposite direction. In this position detector, the resolution of 0.1 $\mu m$ can be realized and the interpolation accuracy of 0.8 $\mu m$ can be realized.

As set out, according to the magnetic sensor of the present invention, the two MR element groups, each having at least two MR elements, are disposed symmetrically with respect to a common central line so that, when the magnetic sensor is moved in an opposing relation to the magnetic scale, a rise of temperature in the MR elements is compensated for, thereby the sine wave output of constant amplitude having less distortion being generated from the magnetic sensor.

According to the position detector of the present invention, the magnetic material is plated on the flat surface of the scale base made of glass or the like and the magnetic sensor is disposed in an opposing relation to the magnetic scale in which the plated layer is magnetized at the constant grating pitch. In this magnetic sensor, at least two MR elements constructing each of two MR element groups are disposed symmetrically with respect to the common central line of the to MR element groups. Therefore, the clearance between the magnetic sensor and the magnetic scale can be kept substantially constant. Also, when the magnetic sensor is moved in an opposing relation to the magnetic scale, the rise of temperature in the MR elements can be compensated for with the result that the magnetic sensor generates the sine wave output of constant amplitude having less waveform distortion.

Furthermore, according to the position detector of the present invention, the magnetic material is plated on the flat surface of the scale base made of glass or the like and the magnetic sensor is disposed in an opposing relation to the magnetic scale in which the plated layer is magnetized at the constant grating pitch. In this magnetic sensor, at least two MR elements constructing each of two MR element groups are disposed alternately. Therefore, the clearance between the magnetic sensor and the magnetic scale can be kept substantially constant. Also, when the magnetic sensor is moved in an opposing relation to the magnetic scale, the rise of temperature in the MR elements can be compensated for with the result that the magnetic sensor generates the sine wave output of constant amplitude having less waveform distortion.

Although preferred embodiments of the invention have been described in detail herein with reference to the accompanying drawings, it is to be understood that the invention is not limited to those precise embodiments and that various changes and modifications thereof may be effected by one skilled in the art without departing from the spirit or scope of the invention as defined in the appended claims.

What is claimed is:

1. A magnetic sensor having at least two magnetoresistance effect element groups characterized in that said two magnetoresistance effect element groups are in series with each other and each of said two magnetoresistance effect element groups is formed of at least two magnetoresistance effect elements connected in series, said magnetoresistance effect elements are disposed in a direction parallel to each other and that said magnetoresistance effect elements of each of said groups are disposed symmetrically on opposite sides of a central line that extends in said parallel direction.

2. A position detector having a magnetic scale magnetized at a constant grating pitch in its length direction and a magnetic sensor located in an opposing relation to said magnetic scale and which is made movable relatively to said magnetic scale in its length direction characterized in that said magnetic scale is formed of a scale base made of glass having a flat surface and a plated layer formed on said scale base by plating a magnetic material, said plated layer being magnetized at said constant grating pitch, and said magnetic sensor is formed of at least two magnetoresistance effect element groups, said two magnetoresistance effect element groups are in series with each other and each of said magnetoresistance effect element groups is formed of at least two magnetoresistance effect elements connected in series, said magnetoresistance effect elements of each of said groups are disposed a direction in parallel to each other and that said two magnetoresistance effect elements are disposed symmetrically on opposite sides of a common central line that extends in said parallel direction.

3. A position detector having a magnetic scale magnetized at a constant grating pitch of 80 $\mu m$ in its length direction and a magnetic sensor located in an opposing relation to said magnetic scale with a clearance of 40 $\mu m$ and which is made movable relatively to said magnetic scale in its length direction characterized in that said magnetic scale is formed of scale base made of glass having a flat surface and a plated layer formed on said scale base by plating a magnetic material, said plated layer being magnetized at said constant grating pitch, and said magnetic sensor is formed of at least two magnetoresistance effect element groups, said at least two magnetoresistance effect element groups are formed of at least two magnetoresistance effect elements connected in series, and said magnetoresistance effect elements of said at least two magnetoresistance effect element groups are disposed in parallel and alternately.

* * * * *